(12) United States Patent
Umemura et al.

(10) Patent No.: US 8,410,807 B2
(45) Date of Patent: Apr. 2, 2013

(54) TEST SYSTEM AND PROBE APPARATUS

(75) Inventors: Yoshiharu Umemura, Kanagawa (JP); Yoshio Komoto, Gunma (JP)

(73) Assignee: Advantest Corporation, Tokyo (JP)

( * ) Notice: Subject to any disclaimer, the term of this patent is extended or adjusted under 35 U.S.C. 154(b) by 249 days.

(21) Appl. No.: 12/901,484

(22) Filed: Oct. 8, 2010

(65) Prior Publication Data

US 2011/0062979 A1  Mar. 17, 2011

Related U.S. Application Data

(63) Continuation of application No. PCT/JP2008/058144, filed on Apr. 25, 2008.

(51) Int. Cl.
*G01R 31/00* (2006.01)
(52) U.S. Cl. .................................. 324/755.01
(58) Field of Classification Search .......... None
See application file for complete search history.

(56) References Cited

U.S. PATENT DOCUMENTS

| | | | | |
|---|---|---|---|---|
| 5,317,255 A * | 5/1994 | Suyama et al. | .......... | 324/755.09 |
| 5,828,224 A * | 10/1998 | Maruyama | .......... | 324/756.02 |
| 6,005,401 A * | 12/1999 | Nakata et al. | .......... | 324/756.03 |
| 6,323,663 B1 * | 11/2001 | Nakata et al. | .......... | 324/756.03 |
| 6,492,599 B1 | 12/2002 | Sugihara | | |
| 6,791,347 B2 | 9/2004 | Ishizaka et al. | | |
| 7,091,733 B2 * | 8/2006 | Takekoshi et al. | .......... | 324/750.03 |
| 7,446,544 B2 * | 11/2008 | Igarashi et al. | .......... | 324/756.03 |
| 7,489,147 B2 * | 2/2009 | Kimura et al. | .......... | 324/755.08 |
| 7,679,385 B2 * | 3/2010 | Amemiya et al. | .......... | 324/756.03 |
| 2002/0190740 A1 | 12/2002 | Ishizaka et al. | | |
| 2008/0007280 A1 | 1/2008 | Amemiya et al. | | |

FOREIGN PATENT DOCUMENTS

| | | |
|---|---|---|
| JP | H8-5666 A | 1/1996 |
| JP | 11135582 | 5/1999 |
| JP | 2001-156128 A | 6/2001 |
| JP | 2003-7782 A | 1/2003 |
| JP | 2004-53409 A | 2/2004 |
| JP | 2006-78351 A | 3/2006 |
| JP | 2008-39765 A | 2/2008 |

OTHER PUBLICATIONS

International Search Report (ISR) issued in PCT/JP2008/058144 (parent application) mailed in Jul. 2008 for Examiner consideration.
Written Opinion (PCT/ISA/237) issued in PCT/JP2008/058144 (parent application) mailed in Jul. 2008.
Japanese Office Action dated Jul. 10, 2012 in a counterpart Japanese patent application No. 2010-509021.
Korean Office Action dated Oct. 27, 2011, in a counterpart Korean patent application 10-2010-7021462, citing Foreign Patent document JP2003-007782 which has been submitted in a previous IDS.

(Continued)

*Primary Examiner* — Paresh Patel

(57) ABSTRACT

A probe apparatus includes a wire substrate with terminals; a wafer tray forming a hermetically sealed space with the wire substrate and for mounting a semiconductor wafer; a probe wafer provided between the wire substrate and the wafer tray, having an apparatus connection terminal electrically connected to a terminal of the wire substrate and wafer connection terminals electrically connected to the semiconductor chips respectively and collectively; an apparatus anisotropic conductive sheet provided between the wire substrate and the probe wafer; a wafer anisotropic conductive sheet provided between the probe wafer and the semiconductor wafer; and a decompressing section that decompresses the hermetically sealed space between the wire substrate and the wafer tray, to cause the wafer tray to move to a predetermined position from the wire substrate, to electrically connect the wire substrate and the probe wafer, and to electrically connect the probe wafer and the semiconductor wafer.

12 Claims, 13 Drawing Sheets

OTHER PUBLICATIONS

TW Office Action/ Search Report and English Translation Dated Oct. 3, 2012; Application No. 098113185.

JP Office Action and Partial English Translation Dated Sep. 4, 2012; Application No. 2010509021.

* cited by examiner

TEST SYSTEM AND PROBE APPARATUS

BACKGROUND

1. Technical Field

The present invention relates to a test system and a probe apparatus. In particular, the present invention relates to a test apparatus for testing a plurality of semiconductor chips formed on a semiconductor wafer, and to a probe apparatus electrically connected to the plurality of semiconductor chips formed on the semiconductor wafer.

2. Related Art

One way of examining a semiconductor chip formed on a semiconductor wafer uses a semiconductor wafer container containing therein the semiconductor wafer (e.g., see Patent Document No. 1). Such a semiconductor wafer container is formed by a retaining plate for retaining a semiconductor wafer, a wire substrate provided with a probe to be connected to a terminal of a semiconductor chip, and a sealing material hermetically sealing between the retaining plate and the wire substrate. By the decompression of the hermetically sealed space, the probe of the wire substrate is connected to the terminal of the semiconductor chip.
Patent Document No. 1: Japanese Patent Application Publication No. H8-5666

Regarding this technology, when the interval between terminals for the wire substrate is different from the interval between terminals for the semiconductor chip, one possible method for dealing with this is to insert a pitch conversion substrate between the wire substrate and the semiconductor chip. With this method, it is possible to fix the pitch conversion substrate to the wire substrate. However, when a pitch conversion substrate has a different thermal expansion coefficient from that of a wire substrate, fixing these substrates together will cause stress onto the fixing portion therebetween due to change in temperature. On the contrary, when the pitch conversion substrate is not fixed to the wire substrate, when moving the retaining plate to convert the semiconductor wafer to be tested, the pitch conversion substrate falls off from the wire substrate.

No prior art has revealed a configuration by which a substrate inserted between a wire substrate and a wafer to be tested is retained without causing the above-mentioned problem. Likewise, no prior art has revealed a configuration of electrically connecting these substrates.

SUMMARY

Therefore, it is an object of an aspect of the innovations herein to provide a probe apparatus to be electrically connected to a semiconductor wafer on which a plurality of semiconductor chips are formed, including: a wire substrate provided with a plurality of terminals; a wafer tray forming a hermetically sealed space with the wire substrate, and for mounting the semiconductor wafer on a surface of the wafer tray nearer the hermetically sealed space; a probe wafer provided between the wire substrate and the wafer tray, where apparatus connection terminals provided on a surface of the probe wafer nearer the wire substrate are electrically connected to terminals of the wire substrate, and where a plurality of wafer connection terminals provided on a surface of the probe wafer nearer the wafer tray are electrically connected to the plurality of semiconductor chips respectively in a collective manner; an apparatus anisotropic conductive sheet provided between the wire substrate and the probe wafer and, by being pressed, electrically connecting the terminals of the wire substrate to the apparatus connection terminals; a wafer anisotropic conductive sheet provided between the probe wafer and the semiconductor wafer and, by being pressed, electrically connecting each terminal of the semiconductor wafer to each of the plurality of wafer connection terminals; and a decompressing section that decompresses the hermetically sealed space between the wire substrate and the wafer tray, so as to cause the wafer tray to move to a predetermined position from the wire substrate, to electrically connect the wire substrate and the probe wafer, and to electrically connect the probe wafer and the semiconductor wafer.

A second aspect of the innovations may include a test system for testing a plurality of semiconductor chips formed on a single semiconductor wafer, including: a plurality of test modules for testing the semiconductor chips respectively; and a probe apparatus electrically connecting each of the test modules to a corresponding one of the semiconductor chips, where the probe apparatus including: a wire substrate provided with a plurality of terminals; a wafer tray forming a hermetically sealed space with the wire substrate, and for mounting the semiconductor wafer on a surface of the wafer tray nearer the hermetically sealed space; a probe wafer provided between the wire substrate and the wafer tray, where apparatus connection terminals provided on a surface of the probe wafer nearer the wire substrate are electrically connected to terminals of the wire substrate, and where a plurality of wafer connection terminals provided on a surface of the probe wafer nearer the wafer tray are electrically connected to the plurality of semiconductor chips respectively in a collective manner; an apparatus anisotropic conductive sheet provided between the wire substrate and the probe wafer and, by being pressed, electrically connecting the terminals of the wire substrate to the apparatus connection terminals; a wafer anisotropic conductive sheet provided between the probe wafer and the semiconductor wafer and, by being pressed, electrically connecting each terminal of the semiconductor wafer to each of the plurality of wafer connection terminals; and a decompressing section that decompresses the hermetically sealed space between the wire substrate and the wafer tray, so as to cause the wafer tray to move to a predetermined position from the wire substrate, to electrically connect the wire substrate and the probe wafer, and to electrically connect the probe wafer and the semiconductor wafer.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
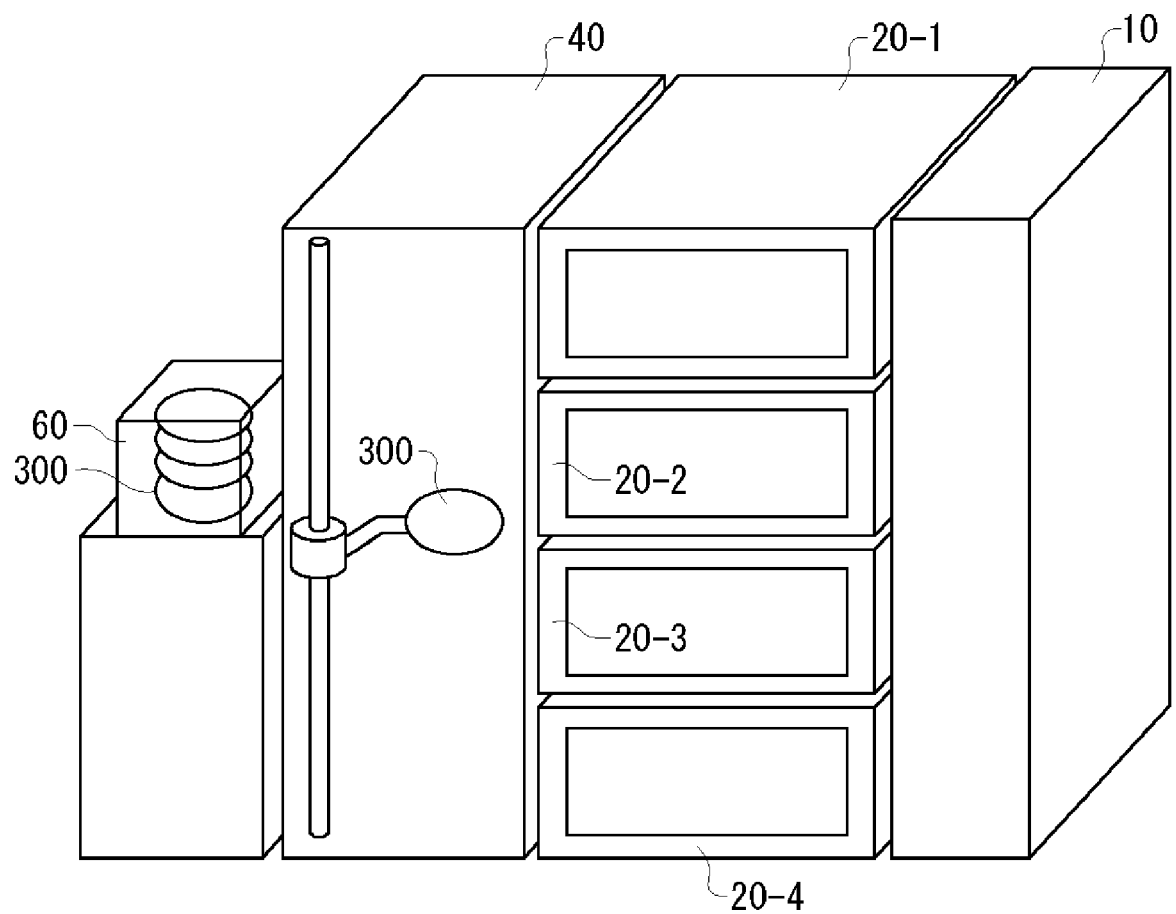
FIG. 1 schematically shows a test system 400 according to an embodiment.

FIG. 1 schematically shows a test system 400 according to an embodiment. The test system 400 tests a plurality of semiconductor chips formed on a semiconductor wafer 300. The test system 400 may test a plurality of semiconductor wafers 300 in parallel. The test system 400 includes a control apparatus 10, a plurality of chambers 20, a conveyance apparatus 40, and a wafer cassette 60.

The control apparatus 10 controls the test system 400. For example, the control apparatus 10 may control the chambers 20, the conveyance apparatus 40, and the wafer cassette 60. The chambers 20 sequentially receive the semiconductor wafers 300 to be tested, to conduct tests on the semiconductor wafers 300 within the chambers 20. Each chamber 20 may independently test a semiconductor wafer 300. In other words, each chamber 20 may test a semiconductor wafer 300 by not synchronizing with the other chambers 20.

The wafer cassette 60 stores therein a plurality of semiconductor wafers 300. The conveyance apparatus 40 conveys each semiconductor wafer 300 stored in the wafer cassette 60 to any one of unoccupied chambers 20. The conveyance apparatus 40 may output a semiconductor wafer 300 after being tested, from the chamber 20 to the wafer cassette 60.

Figure 2:
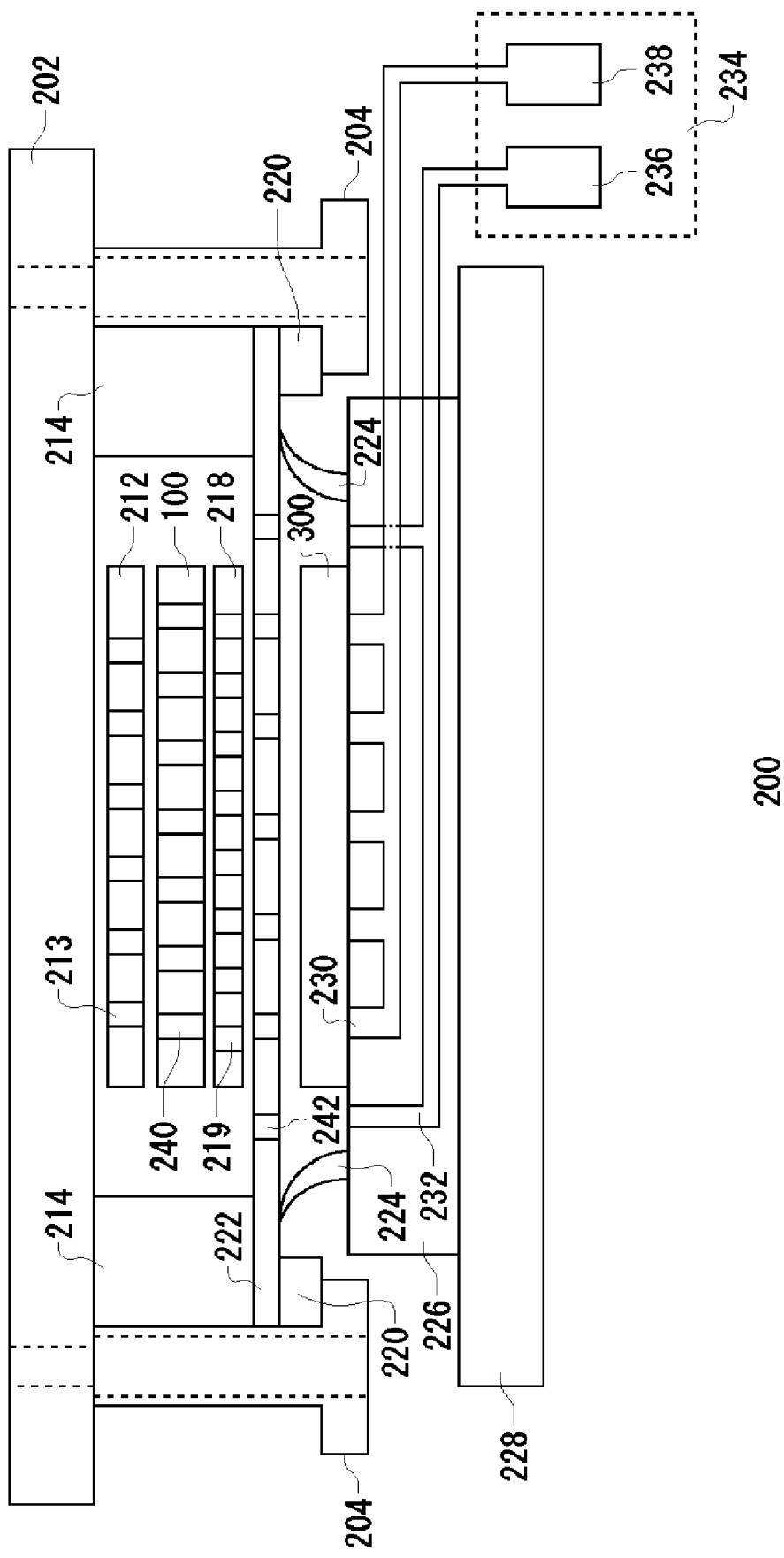
FIG. 2 is a cross sectional view of an exemplary configuration of a probe apparatus 200 provided in a chamber 20 and electrically connected to a semiconductor wafer 300.

FIG. 2 is a cross sectional view of an exemplary configuration of a probe apparatus 200 provided in a chamber 20 and electrically connected to a semiconductor wafer 300. The probe apparatus 200 in this example exchanges signals with a semiconductor wafer 300 in accordance with a control signal from the control apparatus 10. The probe apparatus 200 includes a wire substrate 202, a support section 204, an apparatus anisotropic conductive sheet 212, an apparatus sealing section 214, a probe wafer 100, a wafer anisotropic conductive sheet 218, a membrane 222, a fixing ring 220, a wafer sealing section 224, a wafer tray 226, a wafer stage 228, and a decompression section 234.

The probe apparatus 200 in this example forms a hermetically sealed space for storing therein a probe wafer 100 and a semiconductor wafer 300, by means of the wire substrate 202, the wafer tray 226, the apparatus sealing section 214, and the wafer sealing section 224. By decompression of the hermetically sealed space, the probe wafer 100 is electrically connected to the semiconductor wafer 300, to conduct a test of the semiconductor wafer 300.

The lower surface the wire substrate 202 nearer the hermetically sealed space is provided with a plurality of terminals to facilitate electrical connection with the probe wafer 100. In addition, the wire substrate 202 may exchange signals between the control apparatus 10 and the probe wafer 100. The control apparatus 10 may control the probe wafer 100 via the wire substrate 202. The wire substrate 202 may be a printed substrate provided with a wire or a terminal.

The probe wafer 100 is provided between the wire substrate 202 and the semiconductor wafer 300, and is electrically connected to the wire substrate 202 and the semiconductor wafer 300. The probe wafer 100 may be electrically connected to the wire substrate 202 via the apparatus anisotropic conductive sheet 212 provided between the probe wafer 100 and the wire substrate 202.

By being pressed, the apparatus anisotropic conductive sheet 212 electrically connects the terminal of the wire substrate 202 to the apparatus connection terminal provided on the surface of the probe wafer 100 nearer the wire substrate. The probe wafer 100 is supported such that the position thereof in the vertical direction can be displaced with respect to the lower surface of the wire substrate 202 in a pre-determined range so as to be electrically connected with the wire substrate 202 by pressing the apparatus anisotropic conductive sheet 212 when the hermetically sealed space is subjected to decompression.

The probe wafer 100 may also be electrically connected to the semiconductor wafer 300 via the membrane 222 and the wafer anisotropic conductive sheet 218 provided between the probe wafer 100 and the semiconductor wafer 300. Note that the probe wafer 100 is electrically connected to the plurality of semiconductor chips provided on the semiconductor wafer 300 in a collective manner. The probe wafer 100 may have a diameter larger than that of a semiconductor wafer 300.

The wafer anisotropic conductive sheet 218 is provided between the probe wafer 100 and the membrane 222. By being pressed, the wafer anisotropic conductive sheet 218 electrically connects the wafer connection terminal provided on the surface of the probe wafer 100 nearer the semiconductor wafer to the bump terminal of the membrane 222.

The membrane 222 is provided between the wafer anisotropic conductive sheet 218 and the semiconductor wafer 300. The membrane 222 may have a bump terminal electrically connecting the terminal of the semiconductor wafer 300 to the wafer connection terminal of the probe wafer 100. The fixing ring 220 fixes the membrane 222 to the apparatus sealing section 214.

The fixing ring 220 may be provided in an annular formation along the periphery of the surface of the probe wafer 100 nearer the semiconductor wafer. The inner diameter of the fixing ring 220 may be larger than the diameter of the wafer anisotropic conductive sheet 218 and the diameter of the semiconductor wafer 300.

The membrane 222 has a circular form having substantially the same diameter as the fixing ring 220, and the end of the membrane 222 is fixed to the fixing ring 220. The apparatus anisotropic conductive sheet 212, the probe wafer 100, and the wafer anisotropic conductive sheet 218 are provided between the membrane 222 and the wire substrate 202, and are held at a predetermined position with respect to the wire substrate 202 by the membrane 222. As shown in FIG. 2, a gap may be provided respectively between the apparatus anisotropic conductive sheet 212, the probe wafer 100, the wafer anisotropic conductive sheet 218, and the apparatus sealing section 214. According to such a configuration, by pressing the membrane 222 by means of the semiconductor wafer 300, the semiconductor wafer 300 is electrically connected to the probe wafer 100.

The wafer tray 226, when placed in a predetermined position, forms a hermetically sealed space with the wire substrate 202. The wafer tray 226 in this example forms a hermetically sealed space with the wire substrate 202, the apparatus sealing section 214, and the wafer sealing section 224, as already mentioned. A semiconductor wafer 300 is mounted on a surface of the wafer tray 226 nearer the hermetically sealed space.

The apparatus sealing section 214 is provided along the periphery of the surface of the membrane 222 nearer the wire substrate, and seals between the periphery of the surface of the membrane 222 nearer the wire substrate and the wire substrate 202. The apparatus sealing section 214 may be provided between the lower surface of the wire substrate 202 and the surface of the membrane 222 nearer the wire substrate. In doing so, the apparatus sealing section 214 may be formed by an elastic material having elasticity such as to create conduction by pressure applied by the membrane 222 onto the apparatus anisotropic conductive sheet 212 and the wafer anisotropic conductive sheet 218.

The wafer sealing section 224 is provided on the surface of the wafer tray 226, so as to be along the area corresponding to the periphery of the membrane 222, to seal between the periphery of the surface of the membrane 222 nearer the wafer tray and the wafer tray 226. The wafer sealing section 224 may be formed in an annular formation on the surface of the wafer tray 226.

The wafer sealing section 224 may be formed in a lip-like formation so that the diameter of the annular formation enlarges as the distance from the surface of the wafer tray 226 increases. When the wafer sealing section 224 is pressed against the membrane 222, the pressuring force curves the tip thereof, thereby causing the membrane 222 to approach the semiconductor wafer 300. The wafer sealing section 224 is formed so that the height thereof, in a state where it is not pressed against the membrane 222, from the surface of the wafer tray 226 is larger than the height of the semiconductor wafer 300.

The wafer stage 228 moves the wafer tray 226. For example, the wafer stage 228 moves the wafer tray 226 to an extent that the upper end of the wafer sealing section 224 contacts the membrane 222. According to such a configuration, the wire substrate 202, the wafer tray 226, the apparatus sealing section 214, and the wafer sealing section 224 can form a hermetically sealed space storing therein the probe wafer 100 and the semiconductor wafer 300.

The decompression section 234 decompresses a hermetically sealed space between the wire substrate 202 and the wafer tray 226, which is formed by the wire substrate 202, the wafer tray 226, the apparatus sealing section 214, and the wafer sealing section 224. The decompression section 234 decompresses the hermetically sealed space, after the wafer stage 228 has moved the wafer tray 226 to form the above-mentioned hermetically sealed space.

As a result, the decompression section 234 causes the wafer tray 226 to move to a predetermined position from the wire substrate 202. The wafer tray 226, by being placed in the predetermined position, applies the pressure onto the apparatus anisotropic conductive sheet 212 and the wafer anisotropic conductive sheet 218, to electrically connect the wire substrate 202 and the probe wafer 100, as well as electrically connecting the probe wafer 100 and the semiconductor wafer 300.

In addition, the wafer sealing section 224 may contact the membrane 222, at the inside of the fixing ring 220. In this case, the membrane 222 separates the hermetically sealed space between the wire substrate 202 side and the wafer tray 226 side. Therefore, it is desirable to provide the membrane 222 with penetrating holes 242 connecting these spaces.

In addition, the probe wafer 100, the apparatus anisotropic conductive sheet 212, and the wafer anisotropic conductive sheet 218 may also be desirably provided with penetrating holes 240, penetrating holes 213, and penetrating holes 219 respectively. The penetrating holes provided through the membrane 222, the probe wafer 100, the apparatus anisotropic conductive sheet 212, and the wafer anisotropic conductive sheet 218 are desirably dispersed substantially uniformly within respective surfaces. According to such a configuration, the air absorbed during decompression of the hermetically sealed space is dispersed to flow via the multitude of penetrating holes. Note that the penetrating holes 242, the penetrating holes 240, the penetrating holes 213, and the penetrating holes 219 may also be provided correspond to each other in position, or may be provided at respectively different positions.

Therefore, during decompression of the hermetically sealed space, the pressure applied on the apparatus anisotropic conductive sheet 212 and the wafer anisotropic conductive sheet 218 is dispersed substantially uniformly within respective surfaces, thereby substantially reducing the stress distortion during the decompression. This helps prevent the cracking of the probe wafer 100 or the distortion of the anisotropic conductive sheet, or the like.

In addition, the penetrating holes 242 provided for the membrane 222 enable a single decompression section 234 to decompress the space between the wire substrate 202 and the membrane 222 as well as the space between the membrane 222 and the semiconductor wafer 300.

The decompression section 234 may also cause the semiconductor wafer 300 to attach by suction to the wafer tray 226. The decompression section 234 in this example includes a decompressor 236 for hermetically sealed space, and a decompressor 238 for semiconductor wafer. In addition, the wafer tray 226 is provided with an air inlet path 232 for hermetically sealed space and an air inlet path 230 for semiconductor wafer.

The air inlet path 232 for hermetically sealed space is provided though the wafer tray 226, with one opening thereof formed on the surface of the wafer tray 226 for mounting the semiconductor wafer 300, and the other opening thereof formed on the surface of the wafer tray 226 to be connected to the decompressor 236 for hermetically sealed space. Note that the one opening of the air inlet path 232 for hermetically sealed space is formed inside of the region surrounded by the wafer sealing section 224 on the surface of the wafer tray 226 for mounting the semiconductor wafer 300, to be outside the region for mounting the semiconductor wafer 300. Moreover, the air inlet path 232 for hermetically sealed space may be provided with a plurality of openings on the surface of the wafer tray 226 for mounting the semiconductor wafer 300.

Likewise, the air inlet path 230 for semiconductor wafer is provided though the wafer tray 226, with one opening thereof formed on the surface of the wafer tray 226 for mounting the semiconductor wafer 300, and the other opening thereof formed on the surface of the wafer tray 226 to be connected to the decompressor 238 for semiconductor wafer. Note that the one opening of the air inlet path 230 for semiconductor wafer is formed on the region for mounting the semiconductor wafer 300 on the surface of the wafer tray 226 nearer the hermetically sealed space. Note that the air inlet path 230 for semiconductor wafer may be provided with a plurality of openings on the surface of the wafer tray 226 for mounting the semiconductor wafer 300 for hermetically sealed space.

The decompressor 236 for hermetically sealed space decompresses the space between the wafer tray 226 and the membrane 222, by intaking the air through the air inlet path 232 for hermetically sealed space. As mentioned above, the penetrating holes 242 are provided through the membrane 222. Therefore, by decompressing the space between the wafer tray 226 and the membrane 222, the hermetically sealed space between the wire substrate 202 and the membrane 222 is decompressed as well.

The decompressor 238 for semiconductor wafer intakes the air through the air let path 230 for semiconductor wafer, to cause the semiconductor wafer 300 to attach by suction to the wafer tray 226. Note that the probe apparatus 200 is electrically connected to the semiconductor wafers 300 sequentially conveyed by the conveyance apparatus 40. For this reason, the wafer tray 226 is provided to be separatable from the membrane 222 and from the probe wafer 100, to sequentially transfer the semiconductor wafers 300 to the conveyance apparatus 40. Here, the probe wafer 100 and the membrane 222 or the like are provided on the lower surface of the wire substrate 202. Therefore, the support section 204, in the state separated from the wafer tray 226, retains the probe wafer 100 and the membrane 222 or the like to prevent them from falling off.

Figure 3:
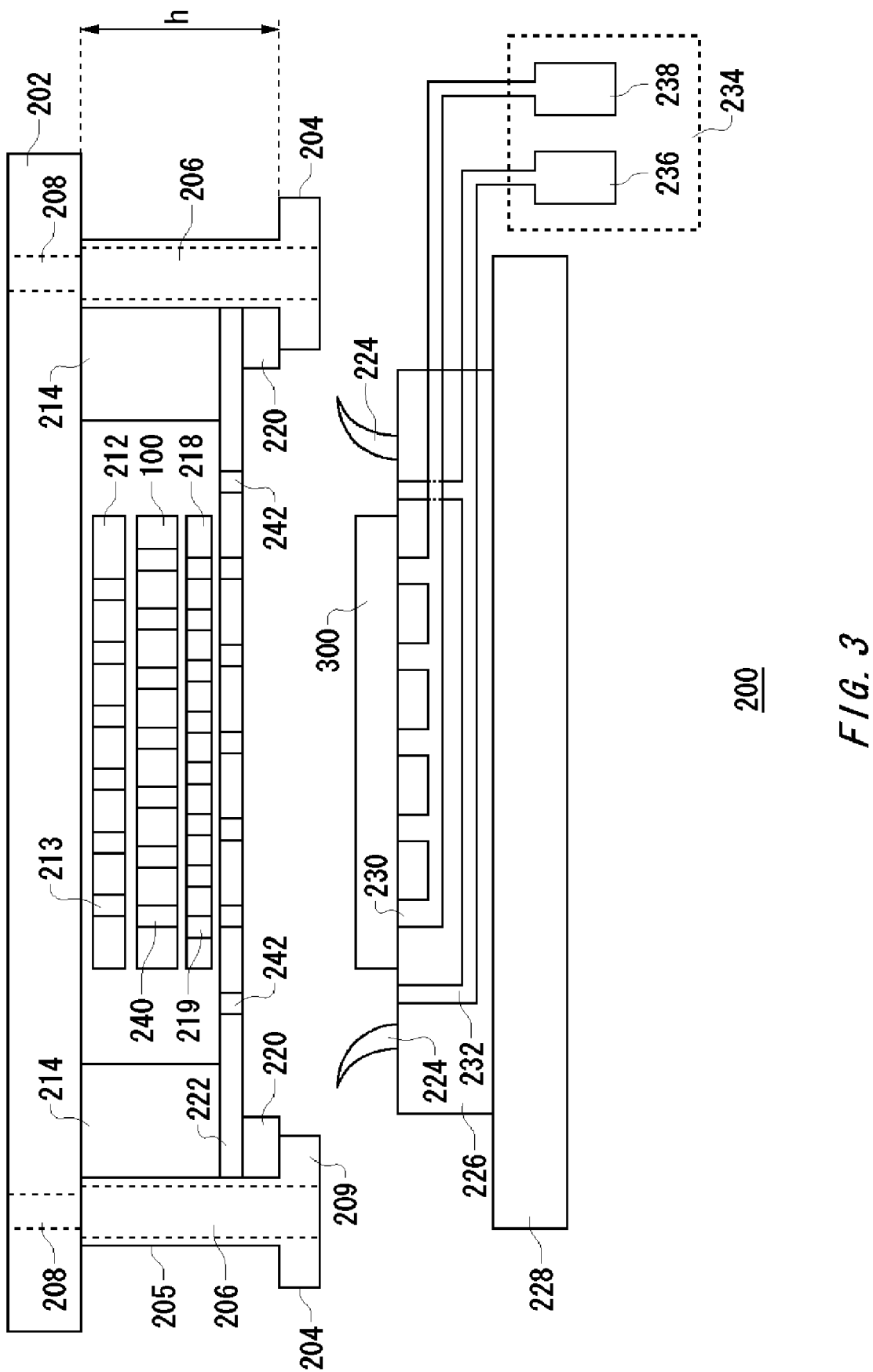
FIG. 3 is a cross sectional view of a probe apparatus 200 in a state in which the wafer tray 226 is separated from the membrane 222 and from the probe wafer 100.

FIG. 3 is a cross sectional view of a probe apparatus 200 in a state in which the wafer tray 226 is separated from the membrane 222. As mentioned above, even in this state, the support section 204 retains the membrane 222 and the probe wafer 100 or the like from falling off from the wire substrate 202.

The support section 204 may support the membrane 222 by supporting the fixing ring 220. As mentioned above, the membrane 222 is fixed to the fixing ring 220. Note that the probe wafer 100 and the anisotropic conductive sheets are provided between the wire substrate 202 and the membrane 222 as explained above, and so the support section 204 can support the probe wafer 100 or the like as well with respect to the wire substrate 202, by supporting the membrane 222 with respect to the wire substrate 202. In this way, the membrane 222 or the like can be prevented from falling off, by a configuration of the support section 204 to support the fixing ring 220 to prevent the fixing ring 220 from falling off from the wire substrate 202.

Also as explained above, the membrane 222 presses the apparatus anisotropic conductive sheet 212, the probe wafer 100, and the wafer anisotropic conductive sheet 218, thereby electrically connecting the probe wafer 100 to the wire substrate 202, and the membrane 222 to the probe wafer 100. Therefore, the support section 204 supports the membrane 222 so that the membrane 222 can approach within a predetermined range of the lower surface of the wire substrate 202. The support section 204 may support the lower end of the fixing ring 220 at a position distant from the lower surface of the wire substrate 202 by a distance "h," so that the lower end of the fixing ring 220 will not be distant from the lower surface of the wire substrate 202 more than the distance "h."

The support section 204 in this example includes a pillar section 205 and a flared section 209. The pillar section 205 is provided to elongate in the vertical direction from the lower surface of the wire substrate 202 to the lower end of the fixing ring 220, in the region outside the periphery of the apparatus sealing section 214. The flared section 209 is provided at the lower end of the pillar section 205 to protrude in the horizontal direction from the pillar section 205, thereby supporting the lower end of the fixing ring 220.

Here, the distance "h" from the lower end of the wire substrate 202 to the upper surface of the flared section 209 is desirably larger than the summation among the thicknesses respectively of the apparatus anisotropic conductive sheet 212, the probe wafer 100, the wafer anisotropic conductive sheet 218, the membrane 222, and the fixing ring 220 under a condition in which the hermetically sealed space is decompressed by the decompressing section 234. By doing so, the support section 204 can support the membrane 222 so that the membrane 222 can press the apparatus anisotropic conductive sheet 212 and the wafer anisotropic conductive sheet 218 when the hermetically sealed space is decompressed.

The distance "h" from the lower surface of the wire substrate 202 to the upper surface of the flared section 209 may be smaller than the summation among the thicknesses respectively of the apparatus anisotropic conductive sheet 212, the probe wafer 100, the wafer anisotropic conductive sheet 218, the membrane 222, and the fixing ring 220 under a condition in which the hermetically sealed space is not decompressed by the decompressing section 234. By doing so, the probe wafer 100 or the like is prevented from excessively oscillating during such an occasion as in the transfer of the probe apparatus 200.

For example, when the hermetically sealed space is not decompressed by the decompressing section 234, the thickness of the apparatus anisotropic conductive sheet 212 is about 0.4 mm, the thickness of the probe wafer 100 is about 0.725 mm, the thickness of the wafer anisotropic conductive sheet 218 is about 0.17 mm, the thickness of the membrane 222 is about 0.025 mm, and the thickness of the fixing ring 220 is about 4.0 mm. Therefore their summation is assumed to be about 5.32 mm. As opposed to this, while the hermetically sealed space is decompressed by the decompressing section 234, the anisotropic sheets will be compressed, and the summation of these thicknesses maybe about 5.175 mm. In this case, the distance "h" from the lower surface of the wire substrate 202 to the upper substrate of the flared section 209 may be about 5.20-5.30 mm.

When the hermetically sealed space is not decompressed by the decompressing section 234, the support section 204 pressures the membrane 222 or the like towards the lower surface of the wire substrate 202 to support it. While the hermetically sealed space is decompressed by the decompressing section 234, on the other hand, the pressure of the support section 204 to the membrane 222 or the like will be about 0.

The support section 204 may also support the membrane 222 or the like so that the position of the membrane 222 or the like can be displaced within a predetermined range in the horizontal direction of the lower surface of the wire substrate 202 as well. As shown in FIG. 3, the position of the side surfaces of the apparatus sealing section 214 and the fixing ring 220 is determined by where the pillar section 205 is positioned. The pillar section 205 can be connected to the lower surface of the wire substrate 202 so as to be movable in the horizontal direction in a predetermined range.

The pillar section 205 may be screwed to the lower surface of the wire substrate 202. If doing so, the diameter of the screw hole 206 formed on the pillar section 205 may be larger than the diameter of the screw hole 208 formed on the wire substrate 202. By adopting this configuration, the membrane 222 or the like can be retained in the state movable in the horizontal direction in a range corresponding to the difference between the diameter of the screw hole 206 and the diameter of the screw hole 208. By adopting this configuration, the stress incurred by the thermal fluctuation or the like can be alleviated even when the thermal expansion coefficient of the wire substrate 202 is different from the thermal expansion coefficient of the fixing ring 220.

By adopting the above-explained configuration, the wire substrate 202 can be easily electrically connected to the probe wafer 100. Moreover, the probe wafer 100 can be easily electrically connected to the semiconductor wafer 300.

Figure 4:
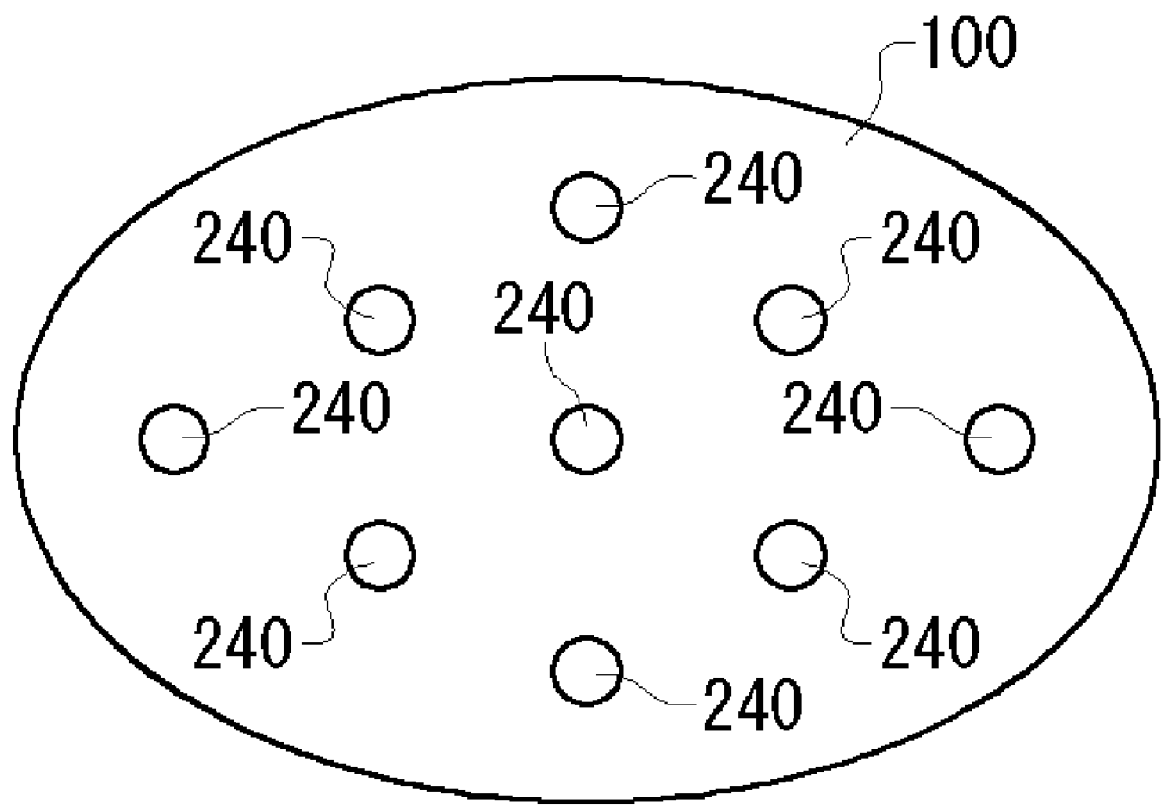
FIG. 4 shows a top view showing an example of a surface of the probe wafer 100 nearer the wire substrate.

FIG. 4 shows a top view showing an example of a surface of the probe wafer 100 nearer the wire substrate. As already explained with reference to FIG. 2 and FIG. 3, a plurality of penetrating holes 240 are formed through the probe wafer 100.

As already explained, the plurality of penetrating holes 240 may be formed to distribute substantially uniformly on the probe wafer 100. Moreover, the plurality of penetrating holes 240 may be provided on the probe wafer 100 except for where the circuitry sections are formed. The penetrating holes 240 may be formed on a boundary region between each circuitry section.

Figure 5:
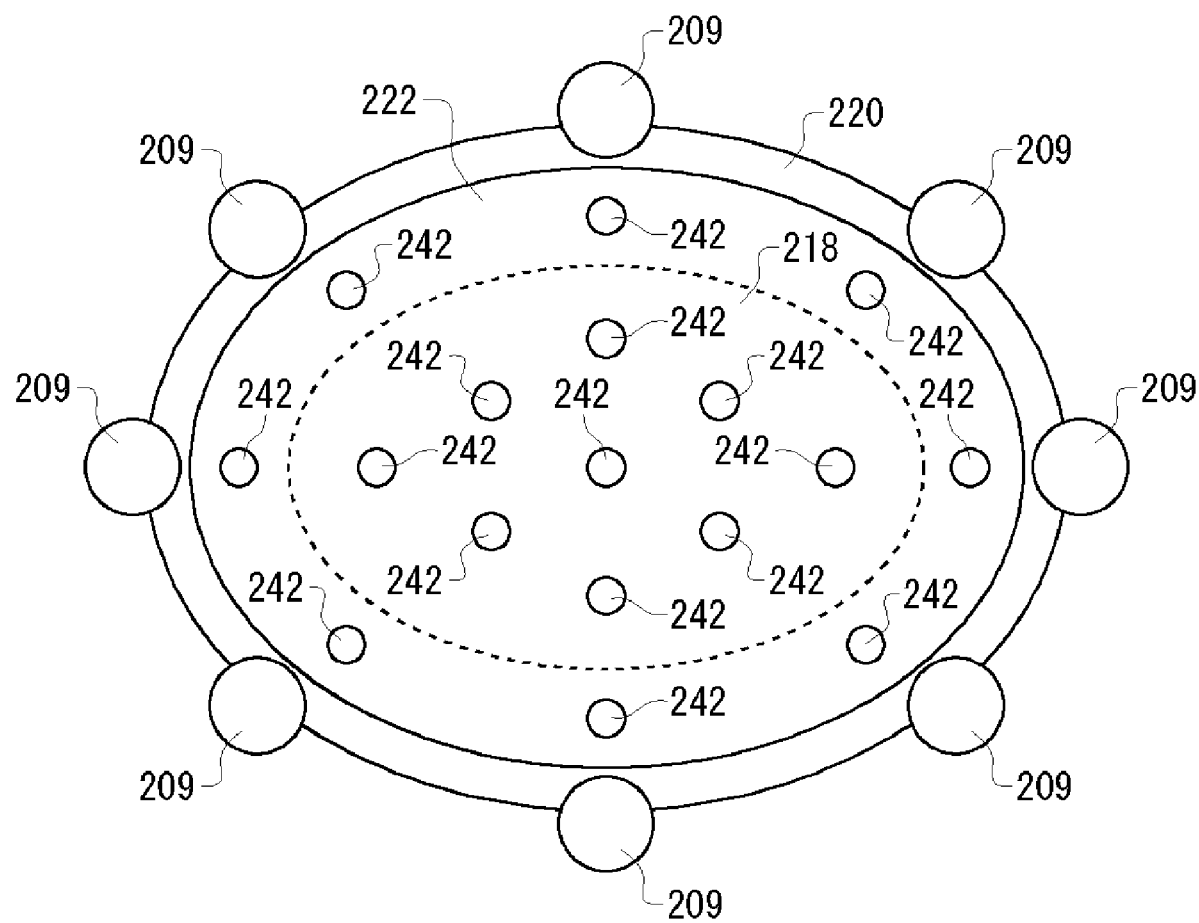
FIG. 5 shows an exemplary configuration of the membrane 222.

FIG. 5 shows an exemplary configuration of the membrane 222. FIG. 5 shows a surface of the membrane 222 nearer the semiconductor wafer 300. As already explained, the membrane 222 stretches inside the annular fixing ring 220.

The penetrating holes 242 may be formed to distribute substantially uniformly on the membrane 222. Moreover, a plurality of bumps are formed on the membrane 222 to conduct the front and rear surfaces thereof. The penetrating holes 242 may be provided between these bumps.

In addition, the flared section 209 of the support section 204 supports the fixing ring 220. There may be a plurality of support sections 204 provided on the circular fixing ring 220 at a predetermined constant interval therebetween.

Figure 6:
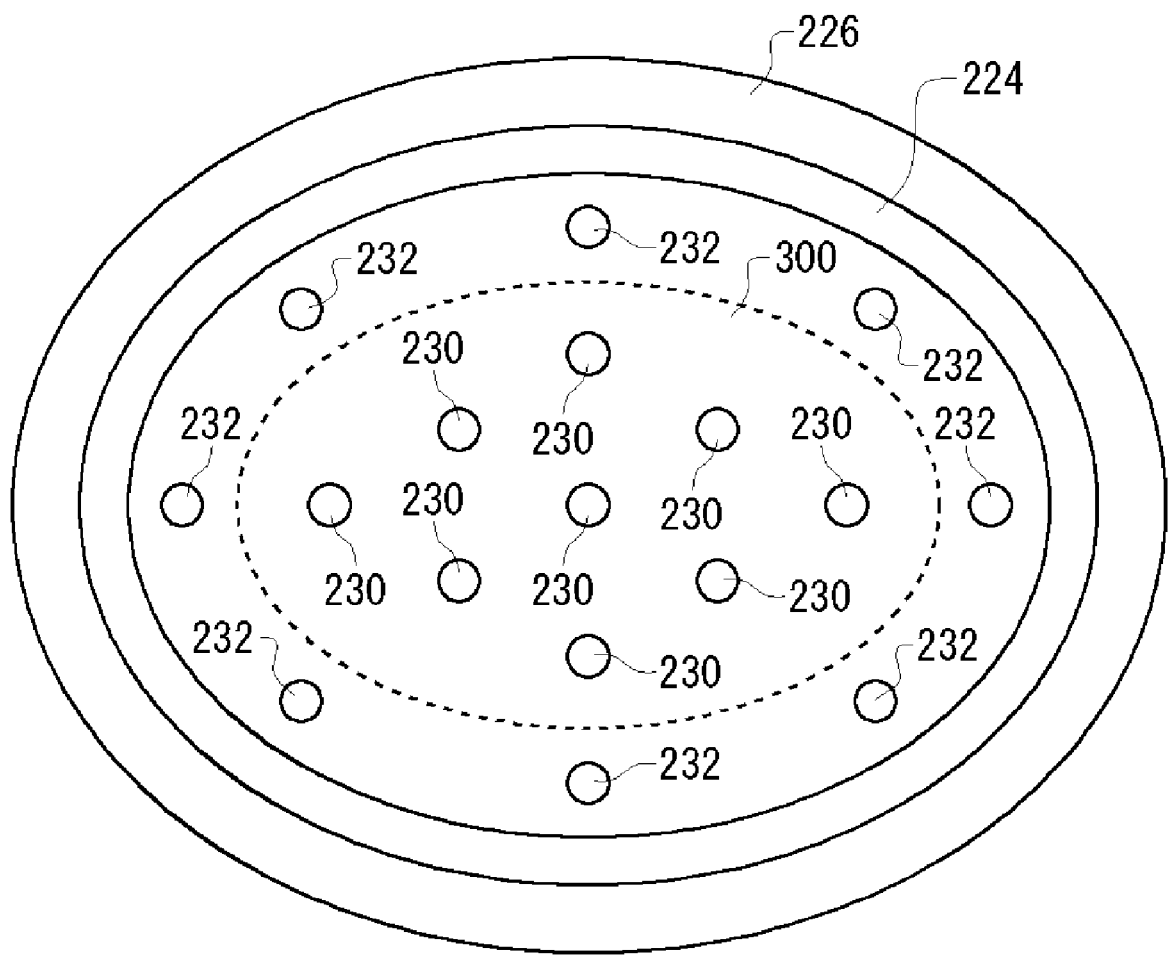
FIG. 6 shows an exemplary configuration of the wafer tray 226.

FIG. 6 shows an exemplary configuration of the wafer tray 226. FIG. 6 shows an upper surface of the wafer tray 226 on which a semiconductor wafer 300 is to be mounted. As already explained, the upper surface of the wafer tray 226 is provided with the wafer sealing section 224. In addition, the upper surface of the wafer tray 226 is provided with the opening of an air inlet path 232 for hermetically sealed space and the opening of an air inlet path 230 for semiconductor wafer.

There may be a plurality of openings of the air inlet path 230 for semiconductor wafer provided in the region on which the semiconductor wafer 300 is to be mounted. There may be a plurality of openings of the air inlet path 232 for hermetically sealed space provided to be outside the region on which the semiconductor wafer 300 is to be mounted, and that to be inside the region corresponding to the wafer sealing section 224.

Figure 7:
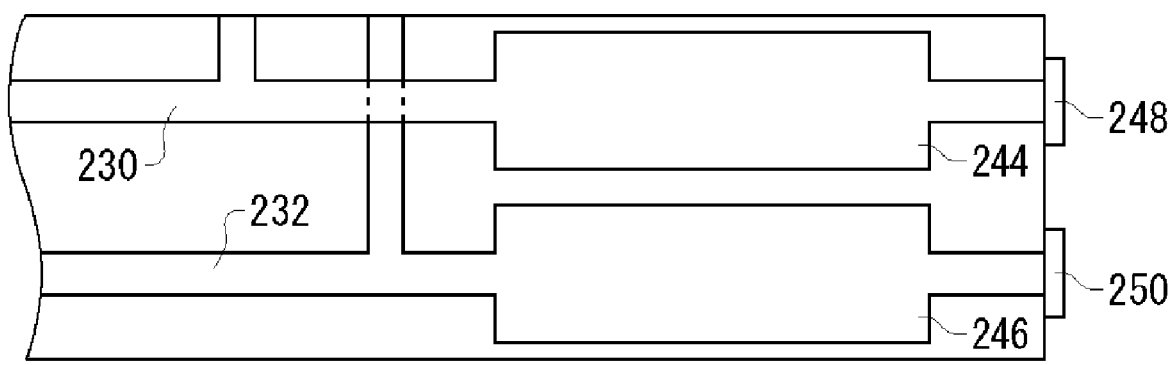
FIG. 7 shows an exemplary configuration of the wafer tray 226.

FIG. 7 shows an exemplary configuration of the wafer tray 226. FIG. 7 shows the cross section of a part of the wafer tray 226. As already explained, inside the wafer tray 226, the air inlet path 232 for hermetically sealed space and the air inlet path 230 for semiconductor wafer are formed. On the side surface of the wafer tray 226 connected to the decompressing section 234, a sealing section 248 and a sealing section 250 are provided to seal the respective openings of the air inlet paths. The sealing section 248 and the sealing section 250 may be provided to seal the respective openings of the air inlet paths when the decompressing section 234 is removed.

An air containing space 244 connected to the air inlet path 230 and having a diameter larger than the diameter of the air inlet path 230 may be formed inside the wafer tray 226. In addition, an air containing space 246 connected to the air inlet path 232 and having a diameter larger than the diameter of the air inlet path 232 may be formed inside the wafer tray 226. By adopting this configuration, the volume of the space to be hermetically sealed can be increased. Therefore, the pressure reduction attributable to minor leak can be alleviated within the hermetically sealed space.

Note that the conveyance apparatus 40 explained with reference to FIG. 1 may convey a wafer tray 226 with a semiconductor wafer 300 mounted thereon, to the inside of each chamber 20. The test system 400 may further include a mount for transferring a wafer tray 226 with a semiconductor wafer 300 mounted thereon, to the conveyance apparatus 40.

The conveyance apparatus 40 may takes out, from the chamber 20, the wafer tray 226 on which the semiconductor wafer 300 after being tested is mounted. Then, the above-explained mount may remove the semiconductor wafer 300 from the wafer tray 226 received from the conveyance apparatus 40, and instead mount, to the wafer tray 226, the next semiconductor wafer 300 to be tested.

When conveying the wafer tray 226 with the semiconductor wafer 300 mounted thereon, it is desirable to attach by suction the semiconductor wafer 300 to the wafer tray 226, and then to hermetically seal the air inlet path 230 for semiconductor wafer by means of the sealing section 248. This arrangement allows secure transport of the semiconductor wafer 300.

The test system 400 may include the wafer trays 226 in number larger than the chambers 20. In this case, even by conducting a test of the semiconductor wafers 300 on all the chambers 20 in parallel, there still remains wafer tray(s) 226 not stored by any chamber 20. Therefore, the conveyance apparatus 40 can mount in advance the next semiconductor wafer(s) 300 to be tested to the wafer tray(s) 226 not stored in any chamber 20, while a test has not been finished by any of the chambers 20. This facilitates quick transport of the next semiconductor wafer(s) 300 to be tested when any of the chambers 20 has finished its test of the semiconductor wafer 300.

Figure 8:
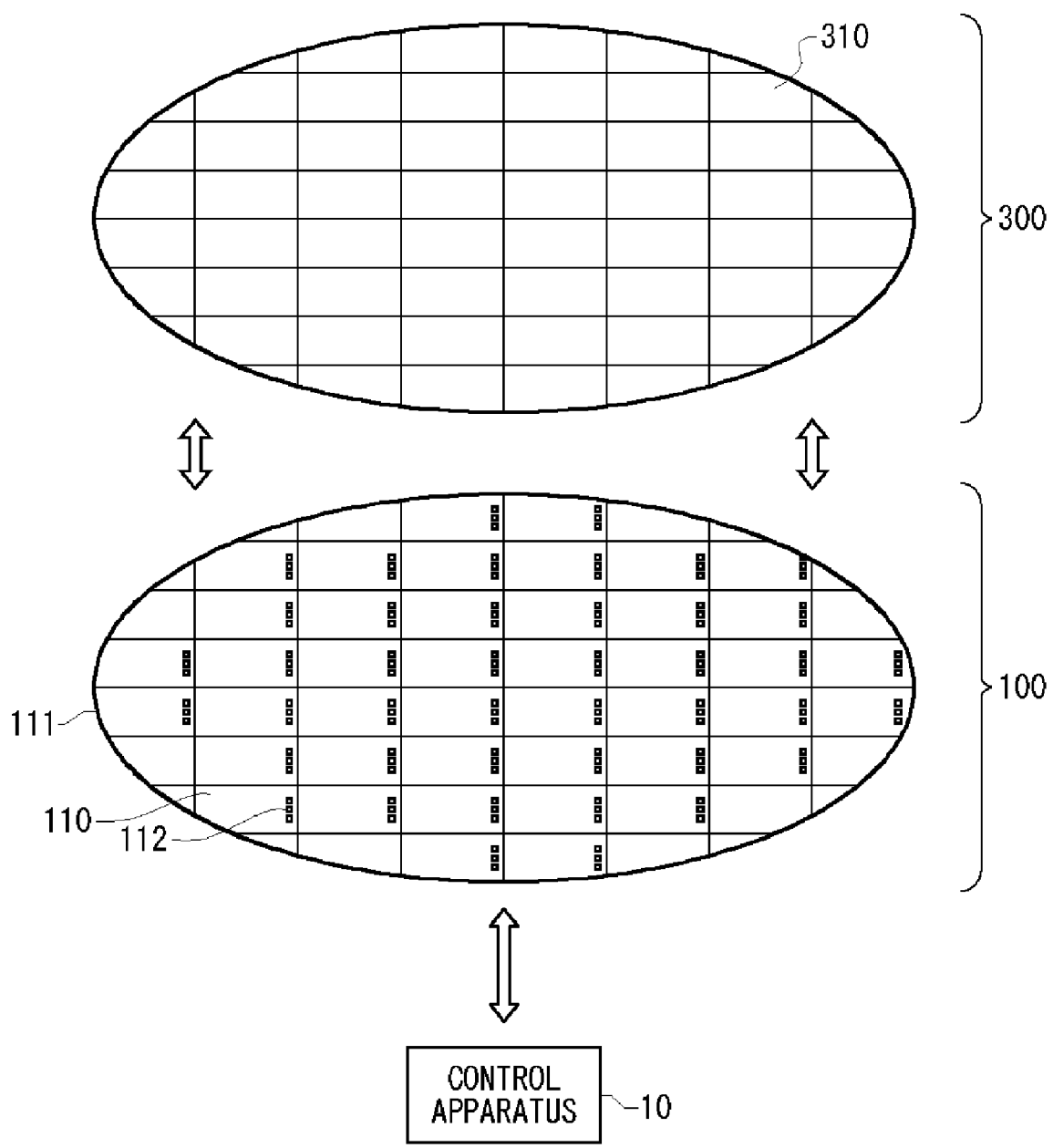
FIG. 8 schematically explains the probe wafer 100.

FIG. 8 schematically explains the probe wafer 100. FIG. 8 shows the probe wafer 100 together with a semiconductor wafer 300. The semiconductor wafer 300 may be a semiconductor substrate having a disk shape. More specifically, the semiconductor wafer 300 may be made of silicon, compound semiconductor, or may be other semiconductor substrates. In addition, a plurality of semiconductor chips 310 tested by the test system 400 may be formed on a semiconductor wafer 300 by a semiconductor process such as exposure.

The probe wafer 100 may electrically connect the semiconductor wafer 300 to the control apparatus 10. More concretely, the probe wafer 100 is provided between each terminal of the wire substrate 202 connected to the control apparatus 10 and each terminal formed on a semiconductor wafer 300, to electrically connect together the corresponding terminals of the wire substrate 202 and the semiconductor wafer 300. The probe wafer 100 in this example includes a wafer substrate 111 and a plurality of wafer connection terminals 112 as detailed later with reference to FIG. 9.

The control apparatus 10 tests each semiconductor chip 310 of a semiconductor wafer 300 via a probe wafer 100. The control apparatus 10 may supply a test signal to each semiconductor chip 310 via the probe wafer 100. In addition, the control apparatus 10 may receive, via the probe wafer 100, a response signal outputted by each semiconductor chip 310 in response to the test signal, and judge the acceptability of the semiconductor chip 310 based on the response signal.

Figure 9:
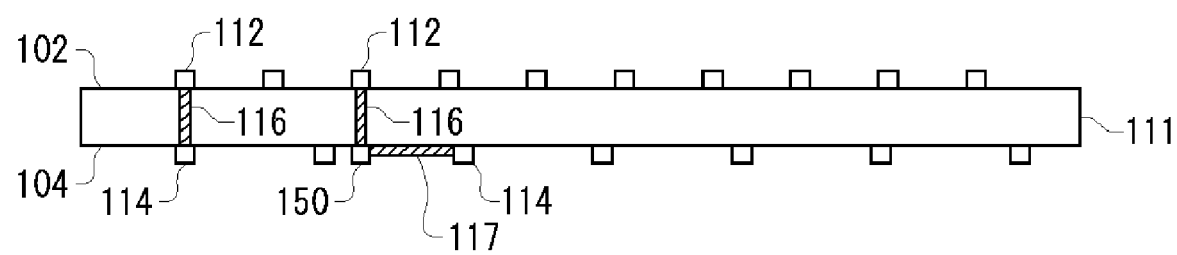
FIG. 9 is an exemplary cross section of the probe wafer 100.

FIG. 9 is an exemplary cross section of the probe wafer 100. As shown in FIG. 8 and FIG. 9, the probe wafer 100 includes a wafer substrate 111, a wafer connection terminal 112, an apparatus connection terminal 114, a through hole 116, a pad 150, and a wire 117.

The wafer substrate 111 is formed by the same semiconductor material as that of the substrate of a semiconductor wafer 300. The wafer substrate 111 may be a silicon substrate. The wafer substrate 111 may also be formed by a semiconductor material having a thermal expansion coefficient that is the same as the thermal expansion coefficient of the substrate of the semiconductor wafer 300. In addition, as shown in FIG. 9, the wafer substrate 111 includes a wafer connection surface 102 and an apparatus connection surface 104 formed as a rear surface opposing the wafer connection surface 102. The wafer connection surface 102 is formed to oppose the semiconductor wafer 300, and the apparatus connection surface 104 is formed to oppose the wire substrate 202.

A plurality of wafer connection terminals 112 are formed on the wafer connection surface 102 of the wafer substrate 111. Each semiconductor chip 310 is assigned at least one wafer connection terminal 112. The wafer connection terminals 112 may be provided so that each input/output terminal of a semiconductor chip 310 is assigned one wafer connection terminal 112. When each semiconductor chip 310 is provided with a plurality of input/output terminals, a plurality of wafer connection terminals 112 may accordingly be provided for the semiconductor chip 310.

Each wafer connection terminal 112 is provided at the same interval as that of each input/output terminal of the semiconductor wafer 300, and is electrically connected to the corresponding input/output terminal of the corresponding semiconductor chip 310. Note that to be electrically connected may indicate a state in which an electric signal can be transferred between two members. The input/output terminals of the wafer connection terminal 112 and the semiconductor chip 310 may be electrically connected to each other, either by direct contact, or indirect contact via another conductor. The input/output terminals of the wafer connection terminal 112 and the semiconductor chip 310 may also be electrically connected to each other in a non-contact state such as by capacitance coupling (also referred to as electrostatic coupling) or inductive coupling (also referred to as magnetic coupling). In addition, a part of the transmission line between the input/output terminals of the wafer connection terminal 112 and the semiconductor chip 310 may be an optical transmission line.

A plurality of apparatus connection terminals 114 are formed on the apparatus connection surface 104 of the wafer substrate 111, and are electrically connected to the wire substrate 202. The apparatus connection terminals 114 are provided in one to one relation with the plurality of wafer connection terminals 112. Here, the apparatus connection terminals 114 are provided at the same interval as the terminals of the wire substrate 202. Therefore as shown in FIG. 9, the apparatus connection terminals 114 may be provided at an interval that is different from the interval of the wafer connection terminals 112.

The through holes 116, the pads 150, and the wires 117 are formed on the wafer substrate 111, and electrically connect the corresponding wafer connection terminals 112 and apparatus connection terminals 114. The pads 150 are provided at positions opposing the wafer connection terminals 112 on the apparatus connection surface 104. The through holes 116 are provided through the wafer substrate 111 so that one end of a through hole 116 is connected to a wafer connection terminal 112 and the other end of the through hole 116 is connected to a pad 150. In addition, the wire 117 electrically connects a pad 150 and an apparatus connection terminal 114 on the apparatus connection surface 104. According to this configuration, the apparatus connection terminals 114 and the wafer connection terminals 112, which may be aligned at different intervals from each other, can be electrically connected to each other.

For example, the wafer connection terminals 112 are provided at the same interval as the input terminals of the semiconductor chip 310 to be electrically connected thereto. Therefore, as shown in FIG. 8 for example, the wafer connection terminals 112 can be provided at a minor interval on a predetermined region for each semiconductor chip 310.

As opposed to this, the apparatus connection terminals 114 may be provided at an interval that is wider than the interval for the plurality of wafer connection terminals 112, which corresponds to a single semiconductor chip 310. The apparatus connection terminals 114 may be provided at a constant interval within the apparatus connection surface 104 so as to be distributed substantially uniformly.

In the probe wafer 100 in this example, the wafer substrate 111 is formed by the same semiconductor material as that of the substrate of the semiconductor wafer 300, and therefore even when the ambient temperature has fluctuated, the electrical connection can be favorably maintained between the probe wafer 100 and the semiconductor wafer 300. Therefore, in such a case that the semiconductor wafer 300 is tested by being heated, the semiconductor wafer 300 can be accurately tested.

Also because the wafer substrate 111 is formed by a semiconductor material, it is easy to form a multitude of wafer connection terminals 112 or the like on the wafer substrate 111. For example, it is easy to form the wafer connection terminals 112, the apparatus connection terminals 114, the through holes 116, and the wires 117 by a semiconductor process such as exposure. It becomes accordingly easy to form, on the wafer substrate 111, a multitude of wafer connection terminals 112 or the like corresponding to the multitude of semiconductor chips 310. In addition, the terminals of the probe wafer 100 may be formed on the wafer substrate 111 by means of plating or vapor coating of a conductive material.

In this way, the both surfaces of the probe wafer 100 may be respectively provided with terminals. As already explained with reference to FIG. 2 through FIG. 7, an anisotropic conductive sheet is provided for each surface of the probe wafer 100. The probe apparatus 200 having the configuration explained with reference to FIG. 2 through FIG. 7 can efficiently connect the wire substrate 202, the probe wafer 100, and the semiconductor wafer 300.

Also, as explained in FIG. 8, a plurality of circuitry sections 110 may be formed on the probe wafer 100. At least one circuitry section 110 is provided for each one of the semiconductor chips 310, to test the semiconductor chip 310. The control apparatus 10 may exchange signals with the circuitry sections 110.

Figure 10:
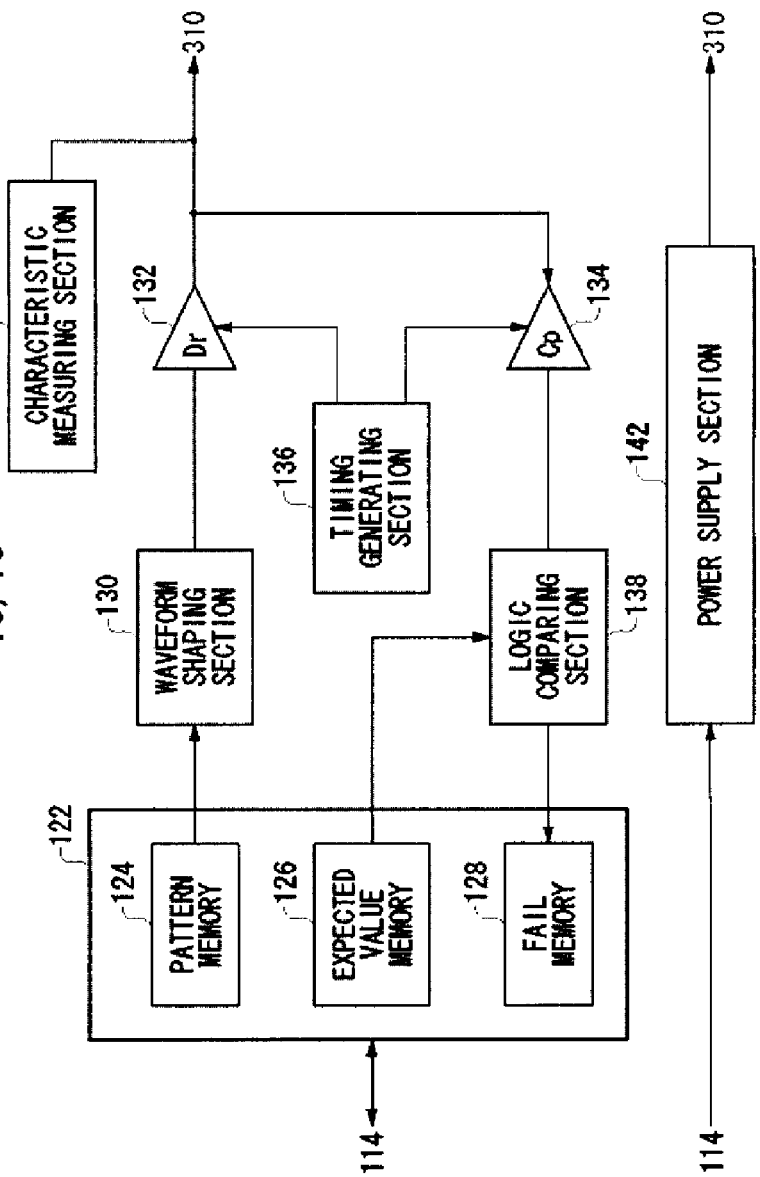
FIG. 10 is a block diagram showing an exemplary functional configuration of a circuitry section 110.

FIG. 10 is a block diagram showing an exemplary functional configuration of a circuitry section 110. A circuitry section 110 includes a pattern generating section 122, a waveform shaping section 130, a driver 132, a comparator 134, a timing generating section 136, a logic comparing section 138, a characteristic measuring section 140, and a power supply section 142. Note that a circuitry section 110 may have the configuration as shown in FIG. 10 for each input/output pin of the semiconductor chip 310 connected thereto.

The pattern generating section 122 generates a logic pattern of a test signal. The pattern generating section 122 in this example includes a pattern memory 124, an expected value memory 126, and a fail memory 128. The pattern generating section 122 may output a logic pattern pre-stored in the pattern memory 124. The pattern memory 124 may store a logic pattern supplied from the control apparatus 10 prior to starting of a test. The pattern generating section 122 may also generate the logic pattern based on an algorithm supplied in advance.

The waveform shaping section 130 shapes the waveform of a test signal based on the logic pattern supplied from the pattern generating section 122. The waveform shaping section 130 may shape the waveform of a test signal by outputting the voltage corresponding to each logic value of the logic pattern for each predetermined bit period.

The driver 132 outputs a test signal corresponding to the waveform supplied from the waveform shaping section 130. The driver 132 may output a test signal corresponding to the timing signal supplied from the timing generating section 136. The driver 132 may output a test signal having the same period as that of the timing signal. The test signal outputted from the driver 132 is supplied to the corresponding semiconductor chip 310 via a switch section or the like.

The comparator 134 measures a response signal outputted from a semiconductor chip 310. The comparator 134 may measure the logic pattern of a response signal by sequentially detecting the logic values of the response signal according to the strobe signals supplied from the timing generating section 136.

The logic comparing section 138 functions as a judging section that judges the acceptability of the corresponding semiconductor chip 310 based on the logic pattern of the response signal measured by the comparator 134. The logic comparing section 138 may judge the acceptability of a semiconductor chip 310 by examining whether the expected value pattern supplied from the pattern generating section 122 matches the logic pattern detected by the comparator 134. The pattern generating section 122 may supply, to the logic comparing section 138, the expected value pattern pre-stored in the expected value memory 126. The expected value memory 126 may store a logic pattern supplied from the control apparatus 10 prior to starting of a test. The pattern generating section 122 may also generate the expected value pattern based on an algorithm supplied in advance.

The fail memory 128 stores a comparison result of the logic comparing section 138. When testing a memory region of a semiconductor chip 310, the fail memory 128 may store the acceptability judgment result of the logic comparing section 138, for each address of the semiconductor chip 310. The control apparatus 10 may read the acceptability judgment result stored in the fail memory 128. The apparatus connection terminal 114 may output the acceptability judgment result stored in the fail memory 128, to the control apparatus 10 outside the probe wafer 100.

The characteristic measuring section 140 measures the waveform of the voltage or the current outputted from the driver 132. The characteristic measuring section 140 may function as a judging section that judges the acceptability of a semiconductor chip 310 by examining whether the waveform of the current or the voltage supplied form the driver 132 to the semiconductor chip 310 satisfies a predetermined specification.

The power supply section 142 supplies the source power for driving a semiconductor chip 310. The power supply section 142 may supply, to the semiconductor chip 310, the source power corresponding to the power supplied from the control apparatus 10 during a test. The power supply section 142 may supply a driving power to each constituting element of a circuitry section 110.

The explained configuration of the circuitry sections 110 helps realize a test system 400 having a control apparatus 10 of a reduced size. An exemplary control apparatus 10 is a general personal computer.

Figure 11:
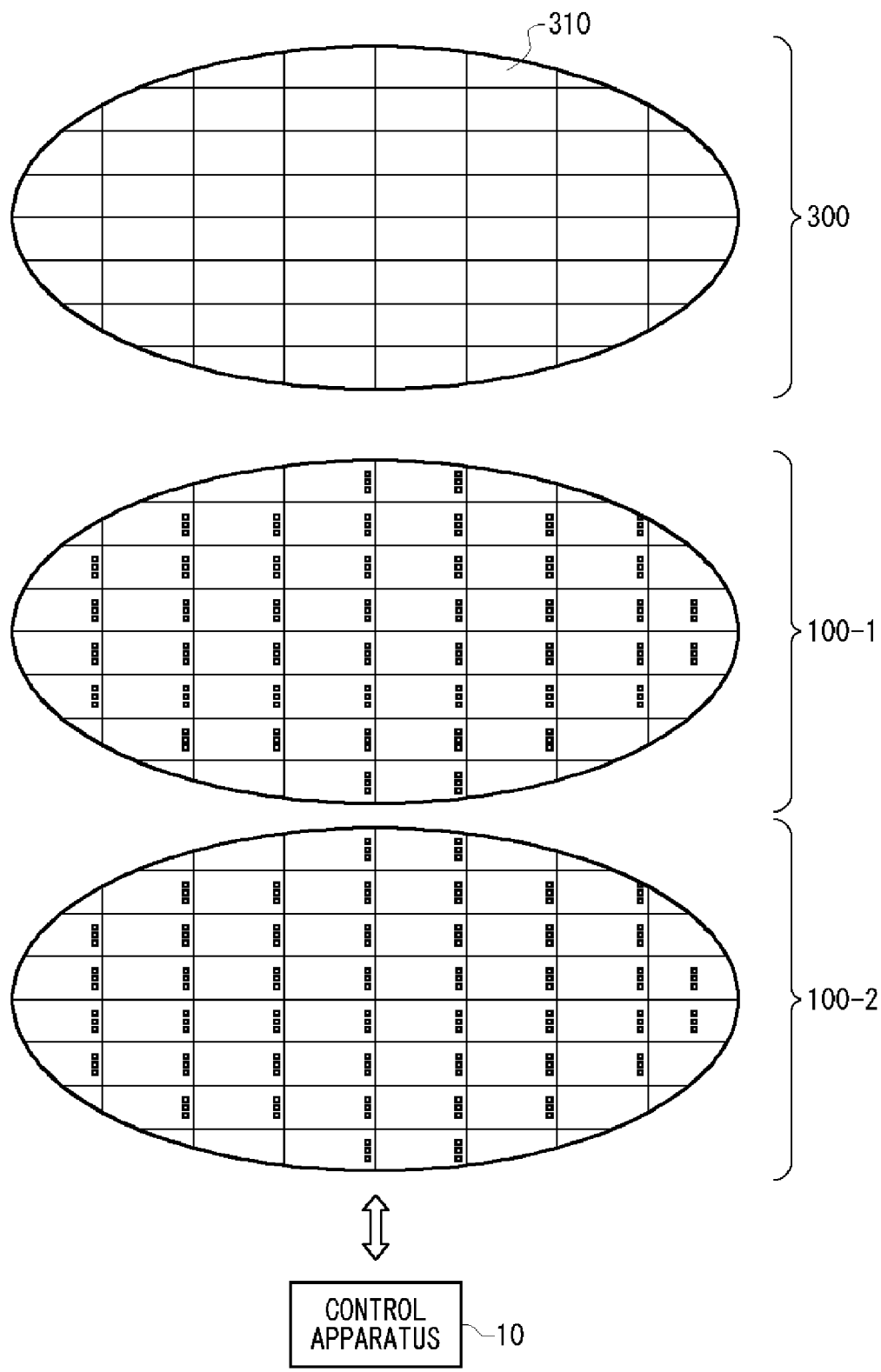
FIG. 11 schematically shows a test of a semiconductor wafer 300 using two probe wafers 100.

FIG. 11 schematically shows a test of a semiconductor wafer 300 using two probe wafers 100. The probe apparatus 200 in this example uses two probe wafers 100 overlapped to each other, instead of a single probe wafer 100, regarding the configuration explained with reference to FIG. 2 through FIG. 7. In this case, the probe apparatus 200 may further include an anisotropic conductive sheet between the two probe wafers 100.

The first probe wafer 100-1 and the second probe wafer 100-2 may function as the probe wafer 100 explained with reference to FIG. 8 through FIG. 10, respectively. The first probe wafer 100-1 nearer the semiconductor wafer 300 may function as the probe wafer 100 for pitch conversion explained with reference to FIG. 9. The second probe wafer 100-2 nearer the wiring substrate 202 may function as the probe wafer 100 including a circuitry section 110 explained with reference to FIG. 10. By adopting this configuration, when a plurality of semiconductor wafers 300 having different terminal intervals from each other are subjected to a same test, the test can be conducted by simply exchanging the probe wafer 100 for pitch conversion.

Figure 12:
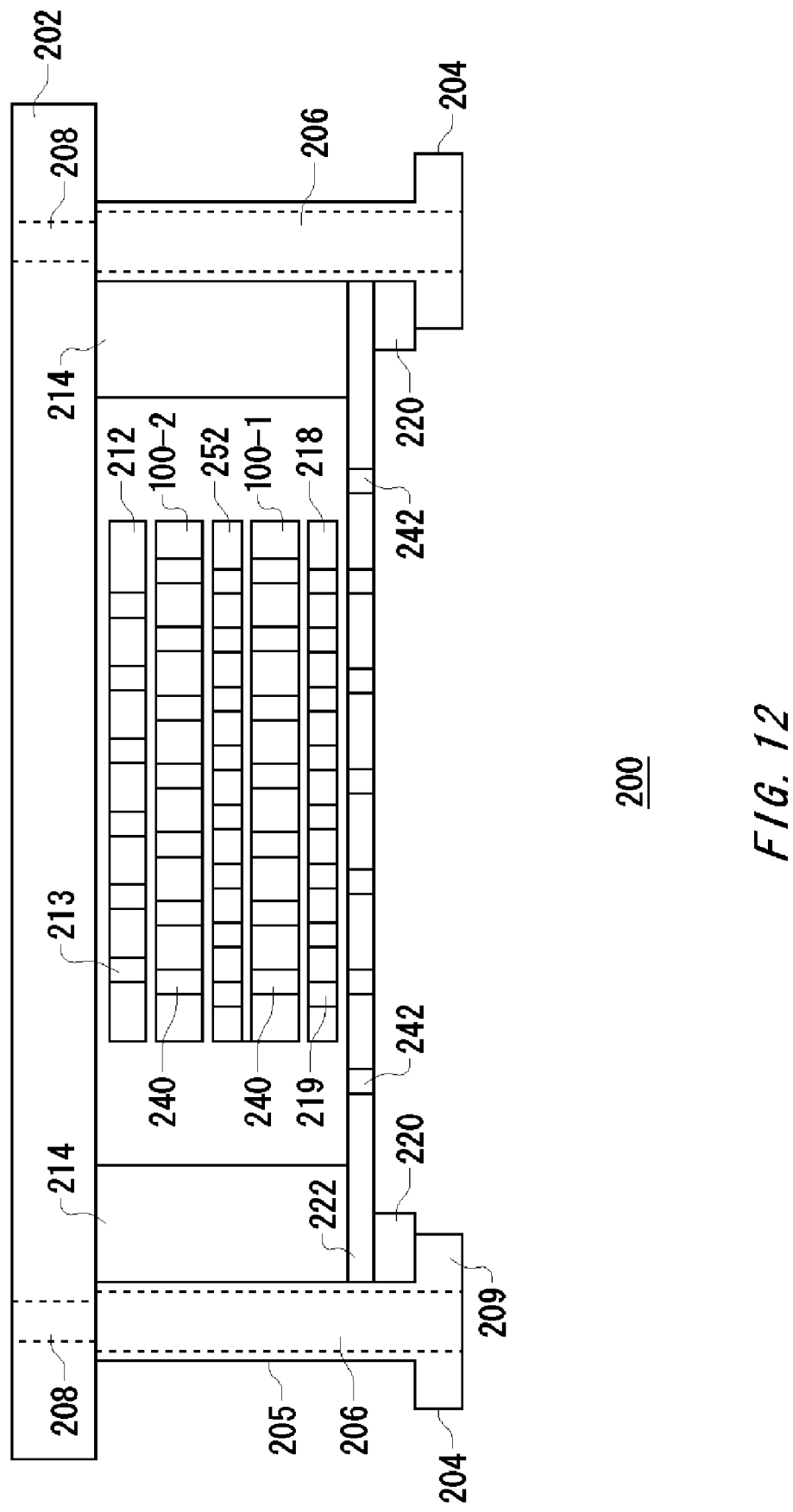
FIG. 12 shows an exemplary configuration of a probe apparatus 200 in the case of using two probe wafers 100.

FIG. 12 shows an exemplary configuration of a probe apparatus 200 in the case of using two probe wafers 100. The configuration of the probe apparatus 200 nearer a semiconductor wafer 300 is the same as the configuration explained with reference to FIG. 2, and so the configuration nearer the semiconductor wafer 300 is not shown in FIG. 12.

The upper surface of the second probe wafer 100-2 is provided with an apparatus anisotropic conductive sheet 212 just as in the case of the probe wafer 100 explained above with reference to FIG. 2 through FIG. 7. The lower surface of the first probe wafer 100-1 is provided with a wafer anisotropic conductive sheet 218 just as in the case of the probe wafer 100 explained above with reference to FIG. 2 through FIG. 7.

An anisotropic conductive sheet 252 is also provided between the first probe wafer 100-1 and the second probe wafer 100-2. Note that these configurations are provided in the space created between the wire substrate 202 ad the membrane 222.

Moreover, through holes 240 are provided through the first probe wafer 100-1 and the second probe wafer 100-2 respectively, for connecting the space between the first probe wafer 100-1 and the wire substrate 202 to the space between the second probe wafer 100-2 and the wafer tray 226. According to this configuration, also in the probe apparatus 200 that utilizes two probe wafers 100, a single decompressing section 234 can be used to decompress the space between the probe wafer 100 and the wire substrate 202 and the space between the probe wafer 100 and the wafer tray 226.

Figure 13:
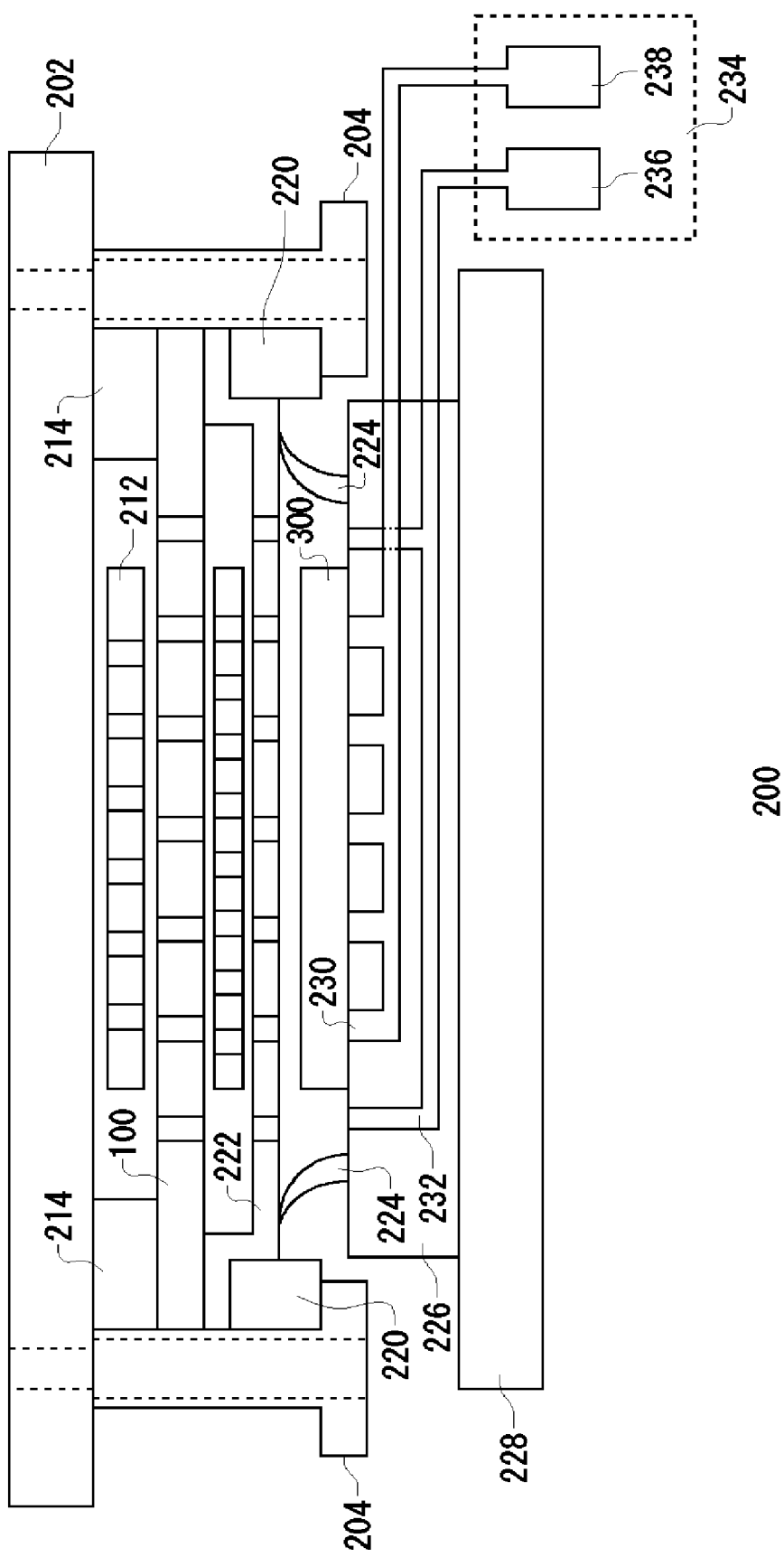
FIG. 13 shows another exemplary configuration of a probe apparatus 200.

FIG. 13 shows another exemplary configuration of a probe apparatus 200. In this probe apparatus 200 of this example, the configuration for fixing the probe wafer 100 and the membrane 222 is different from that of the probe apparatus 200 explained above with reference to FIG. 2. The other configurations may be the same as those of the probe apparatus 200 explained above with reference to FIG. 2.

In this example, the end of the probe wafer 100 is fixed between the apparatus sealing section 214 and the fixing ring 220. The end of the membrane 222 may be fixed to the end of the probe wafer 100. Even in such a case, the provision of through holes through the probe wafer 100 or the like enables to decompress the space at the side of the wire substrate 202 and the space at the side of the wafer tray 226 using a single decompressing section 234.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A probe apparatus to be electrically connected to a semiconductor wafer on which a plurality of semiconductor chips are formed, comprising:
a wire substrate provided with a plurality of terminals;
a wafer tray forming a hermetically sealed space with the wire substrate, and for mounting the semiconductor wafer on a surface of the wafer tray nearer the hermetically sealed space;
a probe wafer provided between the wire substrate and the wafer tray, where apparatus connection terminals provided on a surface of the probe wafer nearer the wire substrate are electrically connected to terminals of the wire substrate, and where a plurality of wafer connection terminals provided on a surface of the probe wafer nearer the wafer tray are electrically connected to the plurality of semiconductor chips respectively in a collective manner;
an apparatus anisotropic conductive sheet provided between the wire substrate and the probe wafer and, by being pressed, electrically connecting the terminals of the wire substrate to the apparatus connection terminals;
a wafer anisotropic conductive sheet provided between the probe wafer and the semiconductor wafer and, by being pressed, electrically connecting each terminal of the semiconductor wafer to each of the plurality of wafer connection terminals; and
a decompressing section that decompresses the hermetically sealed space between the wire substrate and the wafer tray, so as to cause the wafer tray to move to a predetermined position from the wire substrate, to electrically connect the wire substrate and the probe wafer, and to electrically connect the probe wafer and the semiconductor wafer.

2. The probe apparatus according to claim 1, wherein penetrating holes are provided through the probe wafer to connect a wafer-tray-side space to a wire-substrate-side space.

3. The probe apparatus according to claim 2, further comprising:
a membrane provided to oppose a surface of the wafer anisotropic conductive sheet nearer the wafer tray, and electrically connecting the wafer anisotropic conductive sheet and the semiconductor wafer, wherein
penetrating holes are provided through the membrane to connect the wafer-tray-side space to the wire-substrate-side space.

4. The probe apparatus according to claim 3, further comprising:
an apparatus sealing section formed by an elastic material, and provided along a periphery of a surface of the membrane nearer the wire substrate to seal between the periphery of the surface of the membrane nearer the wire substrate and the wire substrate; and
a wafer sealing section formed by an elastic material, and provided on a surface of the wafer tray in a region corresponding to the periphery of the membrane to seal between a periphery of a surface of the membrane nearer the wafer tray and the wafer tray.

5. The probe apparatus according to claim 4, wherein
the wafer tray is provided with an air inlet path for decompressing a space between the wafer tray and the probe wafer, the air inlet path including an opening on a surface of the wafer tray on which the semiconductor wafer is to be mounted outside a region on which the semiconductor wafer is to be mounted, the opening positioned within a region surrounded by the wafer sealing section.

6. The probe apparatus according to claim 5, wherein
the wafer tray is further provided with an air inlet path for semiconductor wafer, the air inlet path for semiconductor wafer including an opening on a region of a surface of the wafer tray nearer the hermetically sealed space on which the semiconductor wafer is to be mounted, and
the decompressing section causes the semiconductor wafer to attach by suction to the wafer tray via the air inlet path for semiconductor wafer.

7. The probe apparatus according to claim 6, wherein
the decompressing section includes a decompressor for hermetically sealed space for intaking air through an air inlet path for hermetically sealed space and a decompressor for semiconductor wafer for intaking air through the air inlet path for semiconductor wafer.

8. The probe apparatus according to claim 7, wherein
the wafer tray is provided with an air containing space connected to any of the air inlet paths and having a diameter larger than a diameter of the air inlet path.

9. The probe apparatus according to claim 8, wherein
the wafer tray is provided with air containing spaces respectively for the air inlet path for hermetically sealed space and for the air inlet path for semiconductor wafer.

10. The probe apparatus according to claim 5, comprising:
a first probe wafer electrically connected to the wire substrate; and
a second probe wafer provided between the first probe wafer and the semiconductor wafer, and electrically connected to the first probe wafer and the semiconductor wafer, wherein
the first probe wafer and the second probe wafer are respectively provided with the penetrating holes, to connect a space created from the first probe wafer towards the wire substrate to a space created from the second probe wafer towards the wafer tray.

11. The probe apparatus according to claim 5, wherein
the probe wafer is provided with a plurality of circuitry sections so that at least one circuitry section is provided for each one of the semiconductor chips to test the semiconductor chip.

12. A test system for testing a plurality of semiconductor chips formed on a single semiconductor wafer, comprising:
a plurality of test modules for testing the semiconductor chips respectively; and
a probe apparatus electrically connecting each of the test modules to a corresponding one of the semiconductor chips, wherein
the probe apparatus including:
a wire substrate provided with a plurality of terminals;
a wafer tray forming a hermetically sealed space with the wire substrate, and for mounting the semiconductor wafer on a surface of the wafer tray nearer the hermetically sealed space;
a probe wafer provided between the wire substrate and the wafer tray, where apparatus connection terminals provided on a surface of the probe wafer nearer the wire substrate are electrically connected to terminals of the wire substrate, and where a plurality of wafer connection terminals provided on a surface of the probe wafer nearer the wafer tray are electrically connected to the plurality of semiconductor chips respectively in a collective manner;

an apparatus anisotropic conductive sheet provided between the wire substrate and the probe wafer and, by being pressed, electrically connecting the terminals of the wire substrate to the apparatus connection terminals;

a wafer anisotropic conductive sheet provided between the probe wafer and the semiconductor wafer and, by being pressed, electrically connecting each terminal of the semiconductor wafer to each of the plurality of wafer connection terminals; and a decompressing section that decompresses the hermetically sealed space between the wire substrate and the wafer tray, so as to cause the wafer tray to move to a predetermined position from the wire substrate, to electrically connect the wire substrate and the probe wafer, and to electrically connect the probe wafer and the semiconductor wafer.

* * * * *